US009654098B2

(12) United States Patent
Nagai

(10) Patent No.: US 9,654,098 B2
(45) Date of Patent: May 16, 2017

(54) SIGNAL RECEPTION CIRCUIT AND ISOLATED SIGNAL TRANSMISSION DEVICE

(71) Applicant: Panasonic Intellectual Property Management Co., Ltd., Osaka (JP)

(72) Inventor: Shuichi Nagai, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 50 days.

(21) Appl. No.: 14/749,727

(22) Filed: Jun. 25, 2015

(65) Prior Publication Data

US 2015/0295574 A1    Oct. 15, 2015

Related U.S. Application Data

(63) Continuation of application No. PCT/JP2014/003487, filed on Jul. 1, 2014.

(30) Foreign Application Priority Data

Jul. 31, 2013    (JP) ................................. 2013-159554

(51) Int. Cl.
*H03K 3/00*    (2006.01)
*H03K 17/687*    (2006.01)
(Continued)

(52) U.S. Cl.
CPC ............ *H03K 17/687* (2013.01); *H02J 50/10* (2016.02); *H03K 2017/6875* (2013.01); *H04B 1/04* (2013.01)

(58) Field of Classification Search
CPC ........ A61K 35/33; A61K 35/35; A61K 35/36; A61K 35/39
See application file for complete search history.

(56) References Cited

U.S. PATENT DOCUMENTS 4,970,420 A * 11/1990 Billings ........... H03K 17/04123
327/430
5,013,926 A    5/1991 Aizawa
(Continued)

FOREIGN PATENT DOCUMENTS

JP    2-303074    12/1990
JP    7-213056    8/1995
(Continued)

OTHER PUBLICATIONS

International Search Report of PCT application No. PCT/JP2014/003487 dated Sep. 22, 2014.
(Continued)

*Primary Examiner* — Sibin Chen
(74) *Attorney, Agent, or Firm* — McDermott Will & Emery LLP

(57) ABSTRACT

A signal reception circuit according to an aspect of the present disclosure includes: an input terminal; an input reference terminal; an output terminal; an output reference terminal; a normally-on type transistor that includes a first terminal connected to the output terminal, a second terminal connected to the output reference terminal, and a control terminal; a first detector circuit that detects an input signal applied between the input terminal and the input reference terminal, to apply an output signal between the output terminal and the output reference terminal; and a second detector circuit that detects the input signal, to apply a negative voltage pulse to the control terminal of the transistor with the output reference terminal as a reference.

11 Claims, 5 Drawing Sheets

(51) Int. Cl.
*H02J 50/10* (2016.01)
*H04B 1/04* (2006.01)

(56) References Cited

U.S. PATENT DOCUMENTS

| | | |
|---|---|---|
| 8,638,134 B2 | 1/2014 | Takao et al. |
| 2014/0049297 A1 | 2/2014 | Nagai et al. |
| 2014/0184309 A1* | 7/2014 | Steeneken ............ H03K 17/689 |
| | | 327/434 |

FOREIGN PATENT DOCUMENTS

| | | |
|---|---|---|
| JP | 2008-067012 | 3/2008 |
| JP | 2012-191408 | 10/2012 |
| WO | 2013/065254 | 5/2013 |

OTHER PUBLICATIONS

The Extended European Search Report dated Jul. 20, 2016 for the related European Patent Application No. 14832688.7.

* cited by examiner

US 9,654,098 B2

SIGNAL RECEPTION CIRCUIT AND ISOLATED SIGNAL TRANSMISSION DEVICE

BACKGROUND

1. Technical Field

The present disclosure relates to a signal reception circuit and an isolated signal transmission device. These are, for example, applied to a gate driver circuit that drives a gate terminal of a semiconductor switch.

2. Description of the Related Art

A gate driver circuit is a circuit that drives a semiconductor switch. The gate driver circuit controls the semiconductor switch on and off by applying a gate voltage to the gate terminal thereof. One high-voltage semiconductor switch is, for example, the insulated gate bipolar transistor (IGBT), which is a type of power semiconductor device. A typical gate driver circuit has a P-type transistor and an N-type transistor at the output part thereof. The semiconductor switch is turned on when P-type transistor operates, and is turned off when the N-type transistor operates. When the semiconductor switch is turned off, the gate current is withdrawn from the semiconductor switch.

A gate driver circuit includes a primary side into which a control signal is input into the gate driver circuit, and a secondary side from which a driving signal is output to the semiconductor switch. In such a gate driver circuit, the reference voltage on the secondary side is extremely high. Therefore, the direct current (DC) component must be isolated, or in other words the signal ground must be isolated, between the primary side and the secondary side. For this reason, a known gate driver circuit has a signal isolator, or a contactless signal transmitter, which is able to realize isolation of the DC component between the primary side and the secondary side. Further, the known gate driver circuit requires an isolated power source for driving a semiconductor switch, separately. The isolated power source, however, leads to increased circuit size. If the gate driver circuit were able to not only isolate the gate signal, but also supply isolated power to the gate of the semiconductor switch, an external isolated power source would be unnecessary, and a more compact gate driver circuit would be possible.

Japanese Unexamined Patent Application Publication No. 2008-067012 discloses a power transmission system using an open-ring electromagnetic resonance coupler for the contactless signal transmitter.

SUMMARY

In a signal reception circuit, high-speed output of the signal is desired.

One non-limiting and exemplary embodiment provides a signal reception circuit and an isolated signal transmission device able to output a signal at high speed.

A signal reception circuit according to an aspect of the present disclosure includes: an input terminal; an input reference terminal; an output terminal; an output reference terminal that has the same potential as the input reference terminal; a normally-on type transistor that includes a first terminal connected to the output terminal, a second terminal connected to the output reference terminal, and a control terminal; a first detector circuit, connected to the input terminal, the output terminal, and the output reference terminal, that detects an input signal applied between the input terminal and the input reference terminal, to apply an output signal between the output terminal and the output reference terminal, the input signal being a modulated signal that is generated by modulating a radio-frequency wave with a pulse signal; and a second detector circuit, connected to the input terminal, the control terminal of the normally-on type transistor, and the output reference terminal, that detects the input signal applied between the input terminal and the input reference terminal, to apply a negative voltage pulse to the control terminal of the normally-on type transistor with the output reference terminal as a reference.

Note that the present disclosure may also be realized as an isolated signal transmission device including a signal reception circuit according to an aspect of the present disclosure.

According to a signal reception circuit and an isolated signal transmission device in accordance with an aspect of the present disclosure, a signal can be output at high speed.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge Forming Basis of the Present Disclosure

The inventors discovered that the following problem occurs with the related art.

Figure 7:
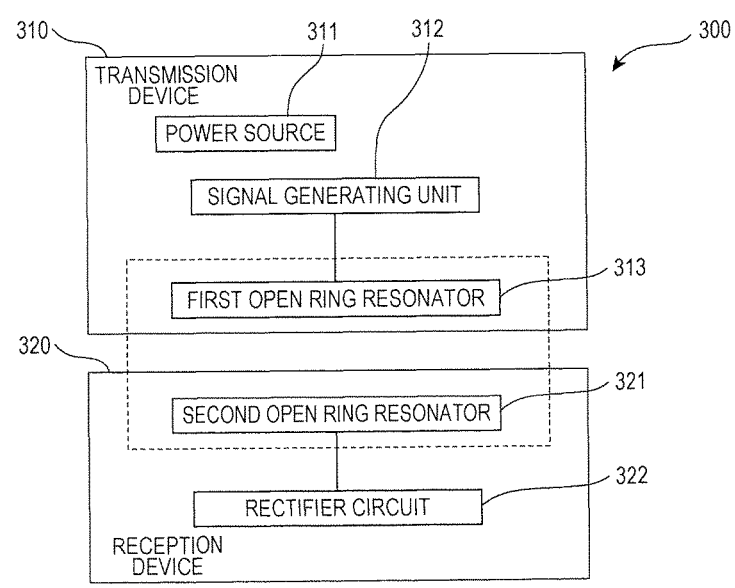
FIG. 7 is a block diagram illustrating a configuration of a power transmission device of the related art.

FIG. 7 is a block diagram illustrating a configuration of a power transmission device 300 in Japanese Unexamined Patent Application Publication No. 2008-067012. The power transmission device 300 has a transmission device 310 and a reception device 320. The transmission device 310 includes a power source 311, a signal generating unit 312, and a first open ring resonator 313. The reception device 320 includes a second open ring resonator 321 and a rectifier circuit 322.

It is desirable for a power transmission device, not only to be able to supply a semiconductor switch with power for maintaining the switch in the on-state, but also to be able to switch the semiconductor switch from the on-state to the off-state at high speed. The power transmission device 300 is able to supply a gate current to the semiconductor switch, but is unable to actively withdraw electrical charge accumulated in the gate of the semiconductor switch. In other words, the power transmission device 300 is able to actively switch the semiconductor switch from the off-state to the on-state, but is unable to actively switch the semiconductor switch from the on-state to the off-state. This is because an electromagnetic resonance coupler, which includes the first open ring resonator 313 and the second open ring resonator 321, is an element that only passively transmits power. Thus, the power transmission device 300 cannot improve the switching speed of the semiconductor switch.

For solving this problem, the power transmission device may have a component able to supply a negative voltage to the gate of the semiconductor switch, for example. Such a component is, for example, a separate subsystem for the negative voltage, and a signal isolator for supplying the negative voltage. However, this configuration may leads to increased circuit size.

The present disclosure provides a signal reception circuit and an isolated signal transmission device capable of outputting an output signal with not only a short rising time, but also a short falling time. For example, when the signal reception circuit and isolated signal transmission device is applied to a gate driver circuit, a driving signal with a short rising time and falling time can be output to the semiconductor switch. Note that a signal reception circuit of the present disclosure may also be applied to circuits other than a gate driver circuit.

Overview of Embodiments

A signal reception circuit according to an aspect of the present disclosure is a signal reception circuit that detects an input signal, which is a signal obtained by modulating a carrier wave with a pulse signal. The signal reception circuit includes: an input terminal and an input reference terminal for receiving the input signal; an output terminal and an output reference terminal for outputting an output signal after detection; a first detector circuit that detects the input signal, and outputs an output signal to the output terminal and the output reference terminal; a normally-on type transistor having a first terminal connected to the output terminal, a second terminal connected to the output reference terminal, and a control terminal; and a second detector circuit that detects the input signal, and outputs a pulse signal of negative voltage to the control terminal of the transistor using the output reference terminal as a reference.

According to the output from the second detector circuit, the transistor switches conduction and non-conduction between the output terminal and the output reference terminal. With this configuration, the output from the signal reception circuit can be switched at high speed. For example, if the signal reception circuit is connected to a semiconductor switch, electrical charge accumulated in the semiconductor switch can be withdrawn through the transistor that is in a short circuit state.

Furthermore, the output signal to be output from the first detector circuit and the pulse signal of negative voltage to be output from the second detector circuit are generated from a common input signal. Therefore, the output signal can be output from the signal reception circuit when the negative voltage is applied to the control terminal of the normally-on type transistor. In other words, the second detector circuit can turn off the transistor when the output signal is generated, and can turn on the transistor when the output signal is not generated.

In a signal reception circuit according to an aspect of the present disclosure, for example, the input signal may be a signal including a first amplitude, and a second amplitude greater than the first amplitude. The second detector circuit, by detecting the first amplitude of the input signal, may output a first voltage value of 0 or a negative value to the control terminal of the transistor using the output reference terminal as a reference, and in addition, by detecting the second amplitude of the input signal, output a second voltage value smaller than the first voltage value to the control terminal of the transistor using the output reference terminal as a reference. The transistor may enter an off-state when the second voltage value is input into the control terminal, and enter an on-state when the first voltage value is input into the control terminal. With this configuration, the transistor is turned on and off according to the first amplitude and the second amplitude included in the input signal.

In a signal reception circuit according to an aspect of the present disclosure, for example, the first detector circuit may output, as the output signal, a pulse signal of positive voltage to the output terminal using the output reference terminal as a reference.

A signal reception circuit according to an aspect of the present disclosure additionally may include a diode connected between the control terminal of the transistor and the output reference terminal.

This enables the potential of the control terminal of the transistor to be adjusted. For example, if a large negative voltage is output from the second detector circuit, that voltage is output from the output reference terminal via the diode connected to the control terminal of the transistor. As a result, reduced output or a loss of output from the output terminal due to the output of the second detector circuit can be prevented.

In a signal reception circuit according to an aspect of the present disclosure, for example, the signal reception circuit additionally may include a resistor connected between the control terminal of the transistor and the output reference terminal.

Since the resistor functions as a speed-up resistor between the control terminal of the transistor and the output reference terminal, the transistor can turn on rapidly.

In a signal reception circuit according to an aspect of the present disclosure, for example, the first detector circuit may include a positive coupling capacitor having a first terminal connected to the input terminal, a positive diode having a cathode connected to a second terminal of the positive coupling capacitor, and an anode connected to the output reference terminal, a positive inductor having a first terminal connected to the second terminal of the positive coupling capacitor, and a positive smoothing capacitor connected between a second terminal of the positive inductor and the output reference terminal. In a signal reception circuit according to an aspect of the present disclosure, for example, the second detector circuit may include a negative coupling capacitor having a first terminal connected to the input terminal, a negative diode having an anode connected to a second terminal of the negative coupling capacitor, and a cathode connected to the output reference terminal, a negative inductor having a first terminal connected to the second terminal of the negative coupling capacitor, and a negative smoothing capacitor connected between a second terminal of the negative inductor and the output reference terminal.

With these configurations, the first detector circuit and the second detector circuit can be realized as a simple demodulation circuit using a diode and an inductor.

In a signal reception circuit according to an aspect of the present disclosure, for example, the threshold voltage of the positive diode may be higher than the threshold voltage of the negative diode. With this configuration, if the input signal is small, for example, the second detector circuit is able to output a large negative voltage, thereby enabling the transistor to turn off reliably.

In a signal reception circuit according to an aspect of the present disclosure, for example, the on-resistance of the positive diode may be lower than the on-resistance of the negative diode. With this configuration, if the input signal is large, the first detector circuit is able to output a large positive voltage. In the case where the positive diode has a higher threshold and a lower on-resistance than the negative diode, a signal reception circuit can operate with appropriate voltages depending on the magnitude of the input signal. Note that the positive diode and the negative diode each are not required to be single elements. For example, the positive diode may also be a circuit part including multiple elements and having diode functionality.

An isolated signal transmission device according to an aspect of the present disclosure, for example, is an isolated signal transmission device that performs isolated transmission of an input signal, and is equipped with an oscillator that generates a carrier wave, a modulator that uses a pulse signal to modulate a carrier wave generated by the oscillator, an electromagnetic resonance coupler that uses electromagnetic resonance to perform isolated transmission of a modulated signal obtained by the modulator, and the above signal reception circuit that detects a signal output from the electromagnetic resonance coupler as an input signal.

With this configuration, since the isolated signal transmission device includes the above signal reception circuit, the isolated signal transmission device can exhibit advantageous effects similar to the above signal reception circuit.

Furthermore, the output signal to be output from the first detector circuit and the pulse signal of negative voltage to be output from the second detector circuit are generated from a common input signal. For this reason, a more compact isolated signal transmission device can be realized, without having to provide separately a signal isolator for the output signal and another signal isolator for the control signal of the transistor.

Embodiments

Hereinafter, embodiments of the present disclosure will be described in detail using the drawings. Note that the embodiments described hereinafter all illustrate specific examples of the present disclosure. Features such as numerical values, shapes, materials, structural components, layout positions and connection states of structural components, steps, and the ordering of steps indicated in the following exemplary embodiments are merely examples, and are not intended to limit the present disclosure. The present disclosure is specified by the claims. Thus, among the structural components in the following exemplary embodiments, structural components that are not described in the independent claim indicating the broadest concept of the present disclosure are described as arbitrary or optional structural components.

Figure 1:
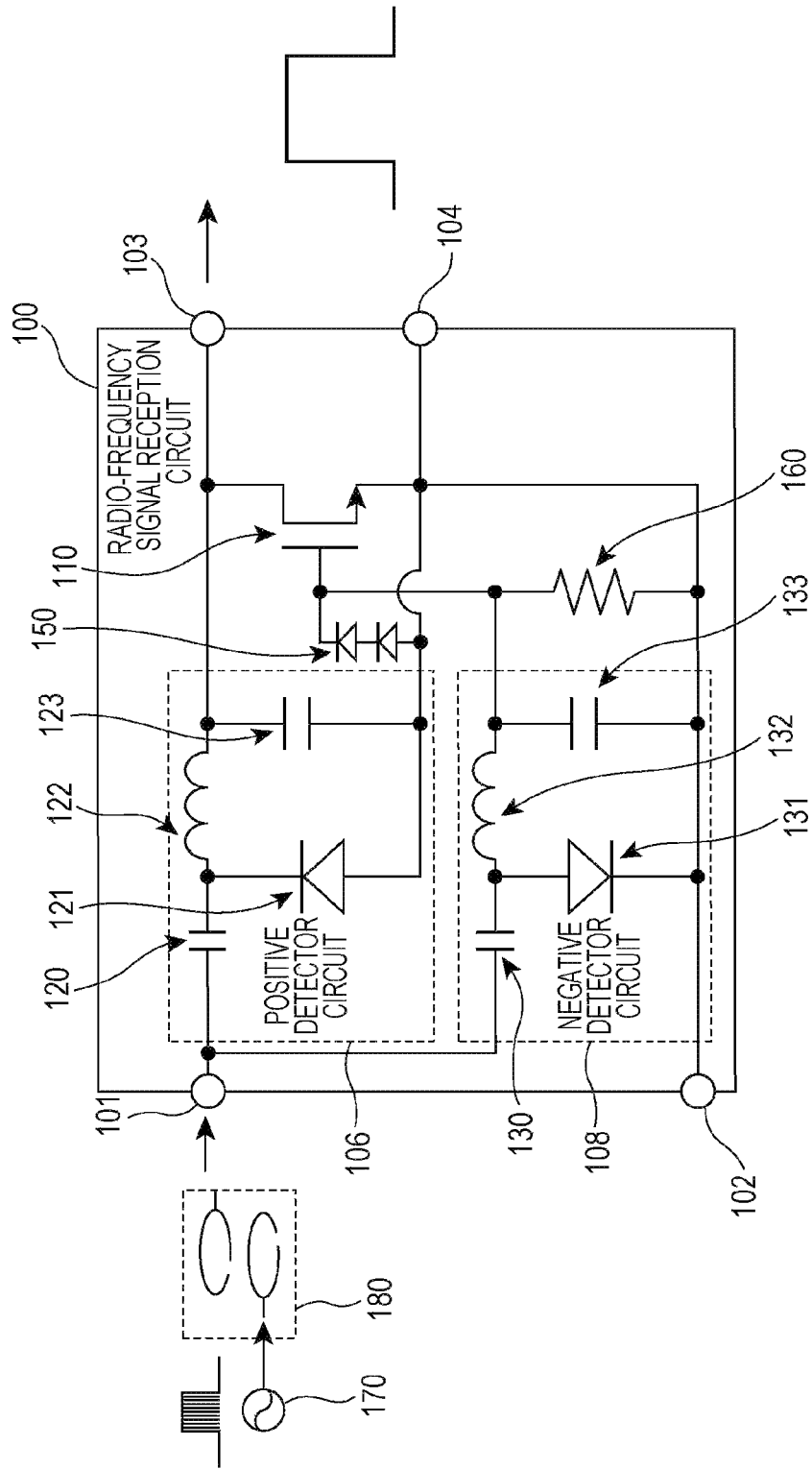
FIG. 1 is a diagram illustrating an example of a radio-frequency signal reception circuit according to an embodiment.

FIG. 1 is a circuit diagram illustrating an example of a radio-frequency signal reception circuit 100 according to the embodiment. The radio-frequency signal reception circuit 100 is used in a gate driver circuit of a semiconductor switch, for example. The radio-frequency signal reception circuit 100 detects an input signal. The radio-frequency signal reception circuit 100 includes an input terminal 101 and an input reference terminal 102 for receiving an input signal, an output terminal 103 and an output reference terminal 104 for outputting a pulse signal after detection, a positive detector circuit 106, a transistor 110, a negative detector circuit 108, a diode 150, and a resistor 160. The input signal is a signal obtained by modulating a pulse signal onto a carrier wave. Note that FIG. 1 additionally illustrates a modulated signal generator circuit 170 and an electromagnetic resonance coupler 180, which are circuits for generating and outputting an input signal to the radio-frequency signal reception circuit 100.

The modulated signal generator circuit 170 is a circuit that generates a modulated signal by modulating a pulse signal onto a carrier wave, which is a radio-frequency wave.

The electromagnetic resonance coupler 180 is a signal isolator that isolatedly transmits, by electromagnetic resonance, a modulated signal input from the modulated signal generator circuit 170. The electromagnetic resonance coupler 180 includes two open rings provided opposite each other, for example. The electromagnetic resonance coupler 180 outputs the modulated signal to the radio-frequency signal reception circuit 100 as an input signal. The input signal is a signal obtained by modulating the amplitude of the radio-frequency wave that is the carrier wave according to a pulse signal, for example. The input signal has a first amplitude, and a second amplitude that is greater than the first amplitude. Although FIG. 1 illustrates a waveform of the input signal with components having voltage values of 0 V or greater, the input signal may also have a waveform with components having voltage values of less than 0. The input signal expresses a waveform that is sign-symmetric about a reference of 0 V in the envelope curve, for example. In the example illustrated in FIG. 1, the first amplitude is 0, and the second amplitude has a designated value greater than 0. In other words, in the example illustrated in FIG. 1, a waveform having a frequency similar to the carrier wave and non-zero amplitude appears in the input signal at a second period, while a constant waveform having an amplitude of 0 appears in the input signal at a first period. In the present disclosure, for the sake of simplicity, the period in which the input signal takes the second amplitude may be called "when the carrier wave appears in the input signal", while the period in which the input signal takes the first amplitude may be called "when the carrier wave does not appear in the input signal". Thus, in the example illustrated in FIG. 1, the input signal is expressed by the presence or absence of the carrier wave. In addition, the input of a waveform of the input signal having the second amplitude is called "the carrier wave is input", while the input of a waveform of the input signal having the first amplitude is called "the carrier wave is not input" in some cases.

The positive detector circuit 106 is a demodulation circuit that detects an input signal input between the input terminal 101 and the input reference terminal 102, and outputs a pulse signal of positive voltage to the output terminal 103 using the output reference terminal 104 as a reference. The positive detector circuit 106 includes a positive coupling capacitor 120 having a first terminal connected to the input terminal 101, a positive diode 121 having a cathode connected to a second terminal of the positive coupling capacitor 120, and an anode connected to the output reference terminal 104, a positive inductor 122 having a third terminal connected to the second terminal of the positive coupling capacitor 120, and a positive smoothing capacitor 123 connected between a fourth terminal of the positive inductor 122 and the output reference terminal 104.

The transistor 110 is a normally-on type transistor having a first terminal connected to the output terminal 103, a second terminal connected to the output reference terminal 104, and a control terminal. For example, the transistor may be an N-type FET. For example, the first terminal may be the drain terminal, the second terminal may be the source terminal, and the control terminal may be the gate terminal.

The negative detector circuit 108 is a demodulation circuit that detects an input signal input between the input terminal 101 and the input reference terminal 102, and outputs a pulse signal of negative voltage to the control terminal of the transistor 110 using the output reference terminal 104 as a reference. The negative detector circuit 108 includes a negative coupling capacitor 130 having a first terminal connected to the input terminal 101, a negative diode 131, connected between a second terminal of the negative coupling capacitor 130 and the output reference terminal 104, having an anode connected to the second terminal of the negative coupling capacitor 130 and a cathode connected to the output reference terminal 104, a negative inductor 132 having a third terminal connected to the second terminal of the negative coupling capacitor 130, and a negative smoothing capacitor 133 connected between a fourth terminal of the negative inductor 132 and the output reference terminal 104.

The diode 150 is one or more diodes connected in series between the control terminal of the transistor 110 and the output reference terminal 104. The diode 150 is connected in the direction of current flow from the output reference terminal 104 towards the control terminal of the transistor 110.

The resistor 160 is a speed-up resistor connected between the control terminal of the transistor 110 and the output reference terminal 104.

According to the radio-frequency signal reception circuit 100 provided with such a configuration, the negative detector circuit 108 outputs a pulse signal to the control terminal of the transistor 110. The pulse signal takes a negative voltage when the carrier wave appears in the input signal, and takes the reference voltage when the carrier wave does not appear in the input signal. As a result, the transistor 110 is turned off when a negative voltage is input from the negative detector circuit 108, and is turned on when the reference voltage is input from the negative detector circuit 108. With this configuration, when the carrier wave appears in the input signal, the radio-frequency signal reception circuit 100 outputs a positive voltage to the output terminal 103 using the output reference terminal 104 as a reference, and when the carrier wave does not appear in the input signal, the radio-frequency signal reception circuit 100 shorts between the output reference terminal 104 and the output terminal 103, and outputs a ground potential to the output terminal 103 using the output reference terminal 104 as a reference. Note that the pulse signal output by the negative detector circuit 108 takes a first voltage value and a second voltage value. The first voltage value is output as a result of the negative detector circuit 108 detecting the first amplitude of the input signal, for example. The second voltage value is output as a result of the negative detector circuit 108 detecting the second amplitude of the input signal, for example. In the example illustrated in FIG. 1, the pulse signal output by the negative detector circuit 108 takes a first voltage value of 0, and a second voltage value of a designated negative value less than 0. Note that the first voltage value may also be negative value, while the second voltage value may be a negative value that is less than the first voltage value, for example. For example, the first voltage value is greater than the threshold voltage of the transistor 110, while the second voltage is less than the threshold voltage of the transistor 110.

Hereinafter, an example of the configuration and operation of the radio-frequency signal reception circuit 100 will be discussed in further detail.

The modulated signal generator circuit 170 generates a modulated signal by performing intensity modulation, or amplitude modulation, of a radio-frequency wave. The modulated signal is isolatedly transmitted by the electromagnetic resonance coupler 180. The radio-frequency signal reception circuit 100 treats the modulated signal as an input signal, detects the input signal, and outputs an output signal as illustrated in FIG. 1 from the output terminal 103, using the output reference terminal 104 as a reference potential. The output signal has a gate driving waveform for a semiconductor switch, for example.

An isolated signal transmission device includes the modulated signal generator circuit 170, the electromagnetic resonance coupler 180, and the radio-frequency signal reception circuit 100. In the isolated signal transmission device, the electromagnetic resonance coupler 180 performs contactless power transmission, or in other words, isolated transmission. For this reason, isolation is ensured between the transmitting side and the receiving side of the electromagnetic resonance coupler 180. Herein, isolation refers to electrical isolation between the signal line on the transmitting side and the signal line on the receiving side, and electrical isolation between the ground of the transmitting side and the ground of the receiving side. Also, a radio-frequency wave refers to a wave used as a carrier wave, having a higher frequency than a pulse signal for modulating the carrier wave. The carrier wave has a frequency of 100 MHz or more, for example. The electromagnetic resonance coupler 180 is configured to have a resonant frequency at the carrier wave. Since the isolated signal transmission device uses a radio-frequency wave as the carrier wave, the electromagnetic resonance coupler 180 can be reduced in size. Furthermore, since the electromagnetic resonance coupler 180 is able to perform efficient power transmission even over long distances, the electromagnetic resonance coupler 180 can have a high dielectric strength voltage corresponding to the distance between two open ring resonators thereof.

The radio-frequency signal reception circuit 100 includes an input terminal 101 that receives an input signal from the electromagnetic resonance coupler 180, an input reference terminal 102 connected to the ground of the electromagnetic resonance coupler 180, an output terminal 103 that outputs a signal, and an output reference terminal 104 that provides the reference potential of the output terminal 103. The signal output from the output terminal 103 is a gate signal to be applied to the gate of a semiconductor switch such as a power device, for example.

The positive diode 121, the positive inductor 122, and the positive smoothing capacitor 123 in the positive detector circuit 106 rectify an input signal input from the input terminal 101 to generate a voltage so that the cathode of the positive diode 121 takes a positive polarity using the anode as a reference.

The negative diode 131, the negative inductor 132, and the negative smoothing capacitor 133 in the negative detector circuit 108 rectify an input signal input from the input terminal 101 to generate a voltage so that the anode of the negative diode 131 takes a negative polarity using the cathode as a reference.

In the positive detector circuit 106, the input terminal 101 and the cathode of the positive diode 121 are connected via the positive coupling capacitor 120. The cathode of the positive diode 121 and one terminal of the positive inductor 122 are connected. The other terminal of the positive inductor 122 is connected to one terminal of the positive smoothing capacitor 123 and the output terminal 103. The other terminal of the positive smoothing capacitor 123 is connected to the anode of the positive diode 121 and the output reference terminal 104. Note that the positive detector circuit 106 may take another configuration insofar as the circuit is a detector circuit for generating a positive voltage from a modulated signal.

In the negative detector circuit 108, the input terminal 101 and the anode of the negative diode 131 are connected via the negative coupling capacitor 130. The anode of the negative diode 131 and one terminal of the negative inductor 132 are connected. The other terminal of the negative inductor 132 is connected to one terminal of the negative smoothing capacitor 133. The other terminal of the negative smoothing capacitor 133 is connected to the cathode of the negative diode 131 and the output reference terminal 104. The input reference terminal 102 is connected to the ground of the electromagnetic resonance coupler 180. Note that the negative detector circuit 108 may take another configuration insofar as the circuit is a detector circuit for generating a negative voltage from a modulated signal.

Furthermore, the output terminal 103 is connected to the drain of the transistor 110, while the output reference terminal 104 is connected to the source of the transistor 110. The gate of the transistor 110 is connected to the line or connection point at which one terminal of the negative inductor 132 and one terminal of the negative smoothing capacitor 133 are connected. Furthermore, the speed-up resistor 160 and the diode 150 for adjusting the gate potential of the transistor 110 each are connected between the gate of the transistor 110 and the source of the transistor 110.

Note that the radio-frequency signal reception circuit 100 may also not include such a speed-up resistor 160 and a diode 150 for gate potential adjustment.

Herein, the transistor 110 is a normally-on type transistor, and is a transistor with a gate threshold voltage of less than 0 V. The transistor 110 is a normally-on type GaN transistor, for example. The transistor 110 has a threshold of −2.5 V, for example. In this case, when the gate voltage is 0 V using the source as a reference, the drain-source shorts, whereas when the gate voltage is −3.0 V using the source as a reference, the drain-source opens.

The transistor 110 is an N-channel transistor, for example.

Next, an example of operation of the radio-frequency signal reception circuit 100 will be described using FIGS. 2 and 3. The radio-frequency signal reception circuit 100 outputs a positive voltage or a 0 V voltage between the output reference terminal 104 and the output terminal 103, depending on the presence or absence of a carrier wave included in an input signal input into the input terminal 101. In other words, the radio-frequency signal reception circuit 100 outputs a positive voltage when the carrier wave appears in the input signal, and outputs 0 V when the carrier wave does not appear in the input signal. Particularly, when the carrier wave does not appear in the input signal, the output terminal 103 and the output reference terminal 104 enter a state equal to being connected by a low resistance of 1Ω or less.

Note that the load connected to the radio-frequency signal reception circuit 100 is a power semiconductor switch, for example. In this case, the output terminal 103 is connected to the gate terminal of the power semiconductor switch, while the output reference terminal 104 is connected to the source terminal of the power semiconductor switch, for example.

By reversing the connection of the anode and the cathode of the positive diode 121, the radio-frequency signal reception circuit 100 is also able to output a negative voltage or a voltage of 0 V. In other words, a first detector circuit is not particularly limited as long as it can output an output signal, and a second detector circuit is not particularly limited as long as it can output a negative voltage pulse to the control terminal of a transistor. The first detector circuit may be a circuit that outputs a positive voltage like the positive detector circuit 106 illustrated in FIG. 1, or a circuit that outputs a negative voltage. In other words, the output signal may also be a positive voltage pulse or a negative voltage pulse.

Figure 2:
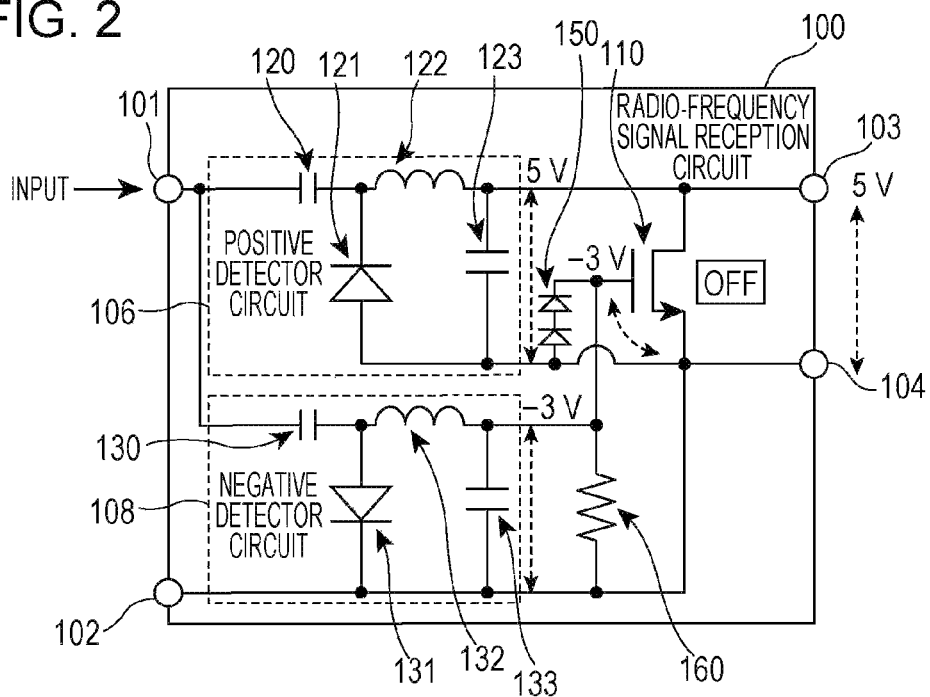
FIG. 2 is a diagram illustrating example operation when a radio-frequency signal reception circuit according to an embodiment outputs an on-voltage.
Figure 3:
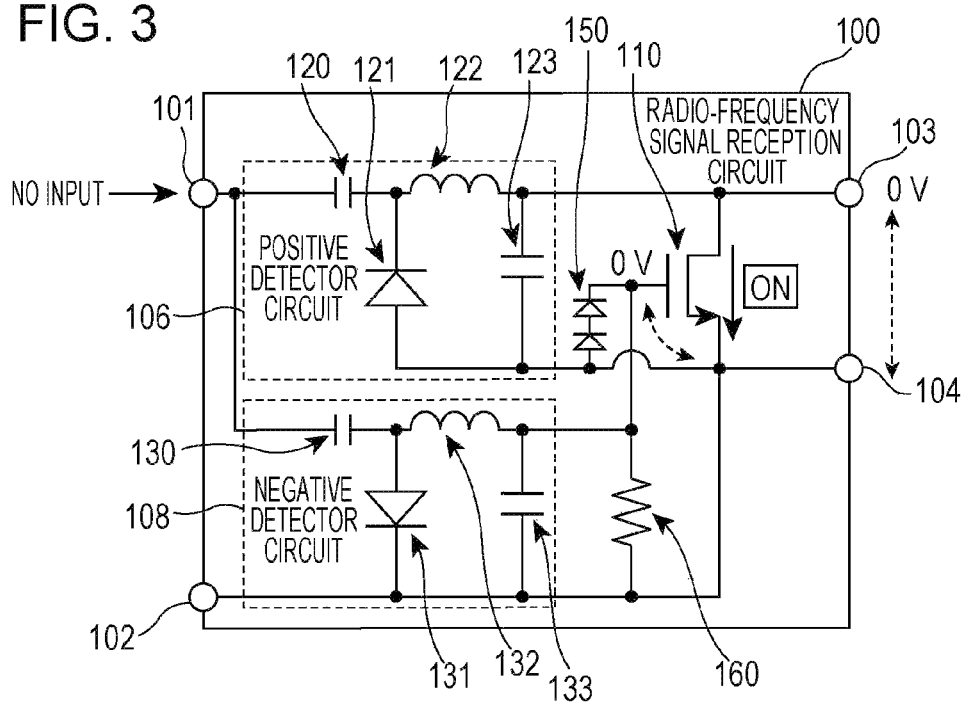
FIG. 3 is a diagram illustrating example operation when a radio-frequency signal reception circuit according to an embodiment outputs an off-voltage.

FIG. 2 is a diagram illustrating an example of the voltage of each terminal in the radio-frequency signal reception circuit 100 when the carrier wave appears in the input signal input into the input terminal 101. The radio-frequency signal reception circuit 100 illustrated in FIG. 2 outputs an on-voltage through the output terminal 103. An on-voltage refers to a gate voltage causing an on-state in the power semiconductor switch to be driven. For example, when the carrier wave is input into the input terminal 101, the positive detector circuit 106 outputs a positive voltage to the output terminal 103 using the input reference terminal 102 as a reference. In the example illustrated in FIG. 2, a voltage of +5 V is supplied from one terminal of the positive inductor 122 to the output terminal 103. Furthermore, the negative detector circuit 108 outputs a negative voltage to the gate terminal of the transistor 110, using the input reference terminal 102 as a reference. In the example illustrated in FIG. 2, a voltage of −3 v is supplied to one terminal of the negative inductor 132 and the gate terminal of the transistor 110. In this case, since the negative inductor 132 and the gate terminal of the transistor 110 are connected, a negative voltage is supplied to the gate terminal of the transistor 110, using the output reference terminal 104 as a reference. In the example illustrated in FIG. 2, −3 V is supplied to the gate terminal of the transistor 110. The supply of a negative voltage to the gate terminal of the transistor 110 causes the transistor 110 to be turned off. Thus, the pathway between the output terminal 103 and the output reference terminal 104 goes open, or in other words, enters a state of extremely high resistance. As a result, a positive voltage is output from the output terminal 103 using the output reference terminal 104 as a reference. In the example illustrated in FIG. 2, +5 V is output from the output terminal 103. This positive voltage turns on the power semiconductor switch connected to the output terminal 103 and the output reference terminal 104, for example.

Next, an example of operation when turning off the power semiconductor switch will be described using FIG. 3. FIG. 3 is a diagram illustrating an example of the voltage of each terminal in the radio-frequency signal reception circuit 100 when the carrier wave does not appear in the input signal input into the input terminal 101. The radio-frequency signal reception circuit 100 illustrated in FIG. 3 outputs an off-voltage through the output terminal 103. An off-voltage refers to a gate voltage causing an off-state in the power semiconductor switch to be driven. In this case, neither the positive detector circuit 106 nor the negative detector circuit 108 generate a voltage. Accordingly, the voltage input into the gate terminal of the transistor 110 becomes 0 V, and the normally-on type transistor 110 is turned on. Thus, the pathway between the drain terminal and the source terminal of the transistor 110 shorts, and thereby the output terminal 103 and the output reference terminal 104 are shorted. In other words, the output voltage of the output terminal 103 and the output reference terminal 104 is 0 V. This causes the electrical charge accumulated in the gate of the power semiconductor switch in the on-state to flow out via the transistor 110. As a result, the radio-frequency signal reception circuit 100 is able to rapidly turn off the power semiconductor switch.

Herein, if the transistor 110 is a transistor with a large gate width, there is less gate resistance when the transistor 110 is in the on-state. Meanwhile, if the transistor 110 is a transistor with a small gate width, the power and time to switch the transistor 110 from the on-state to the off-state may be decreased. For example, the transistor 110 may have a gate width of approximately 500 microns or less.

As above, when a carrier wave is input into the input terminal 101, a gate voltage for putting the power semiconductor switch in the on-state is supplied from the output terminal 103. When a carrier wave is not input into the input terminal 101, the output terminal 103 and the output reference terminal 104 are shorted, and thus the power semiconductor switch may be turned off. In this way, the level of the output signal may be switched according to the presence or absence of a carrier wave in the input signal.

In this way, since the radio-frequency signal reception circuit 100 includes a normally-on type transistor as the transistor 110, the presence or absence of an output voltage may be switched according to the presence or absence of a carrier wave in a single input signal. An isolated signal transmission device may have a single transmitter circuit for outputting a radio-frequency wave to the signal isolator. Specifically, an isolated signal transmission device may have a single modulated signal generator circuit for outputting a modulated signal to the electromagnetic resonance coupler. For this reason, a more compact isolated signal transmission device including such a radio-frequency signal reception circuit 100 can be realized. However, the present disclosure does not exclude the case of providing multiple signal isolators and/or transmitter circuits. Furthermore, since the radio-frequency signal reception circuit 100 uses contactless power transmission, the radio-frequency signal reception circuit 100 is able to generate a negative voltage in addition to an output voltage at the same time. By supplying the negative voltage to the gate terminal of the normally-on type transistor 110, control of the output of the radio-frequency signal reception circuit 100 can be realized.

The radio-frequency signal reception circuit 100 can realize the generation of an output voltage and the control of the transistor 110 at the same time on the basis of a single input signal. The merits of this configuration are as follows.

For example, suppose a method in which an output voltage is continuously supplied to the transistor 110, and in which whether the output voltage is to be output from the radio-frequency signal reception circuit 100 or not is selected according to the on/off switching of the transistor 110. In this method, while the output voltage is not output from the radio-frequency signal reception circuit 100, the power supplied to the transistor 110 is wasted. Thus, this method is inefficient, and power consumption increases.

For example, suppose a method that uses a normally-off type transistor instead of the normally-on type transistor 110. In this case, when the output voltage is not output from the radio-frequency signal reception circuit 100, a voltage for turning on the normally-off type transistor is required. Thus, in this method, two signal subsystems are required, one for the signal for generating an output voltage from the radio-frequency signal reception circuit, and one for the signal that controls the transistor.

Given the above, the radio-frequency signal reception circuit 100 differs from the other methods above, and is able to realize the generation of an output voltage and the control voltage of the transistor 110 at the same time with a single input signal.

Since a normally-on type transistor is used for the transistor 110, the transistor 110 can be switched on at high speed. In the case where a speed-up resistor 160 is disposed between the gate terminal and the source terminal of the transistor 110, the transistor 110 can be switched on at high speed. Note that the resistance value of the resistor 160 may also be reduced to switch on the transistor 110 at high speed. In this case, a large power can be generated by the negative detector circuit 108 to switch off the transistor 110.

The positive detector circuit 106 and the negative detector circuit 108 are connected to the input terminal 101. How to distribute the power of the input signal input from the input terminal 101 between the positive detector circuit 106 and the negative detector circuit 108 is decided by the ratio of the positive coupling capacitor 120 and the negative coupling capacitor 130. If too much power is distributed to the negative detector circuit 108 for turning off the transistor 110, the voltage generated and output by the positive detector circuit 106 may be reduced. Accordingly, the positive coupling capacitor 120 may be the same as or greater than the negative coupling capacitor 130.

Furthermore, in the case where a diode 150 for potential adjustment is connected between the gate terminal and the source terminal of the transistor 110, when a large negative voltage is output from the negative detector circuit 108, the voltage is supplied to the output reference terminal 104 via the diode 150. As a result, a reduction or loss in the output voltage when a large voltage is input into the negative detector circuit 108 can be prevented.

Figure 4:
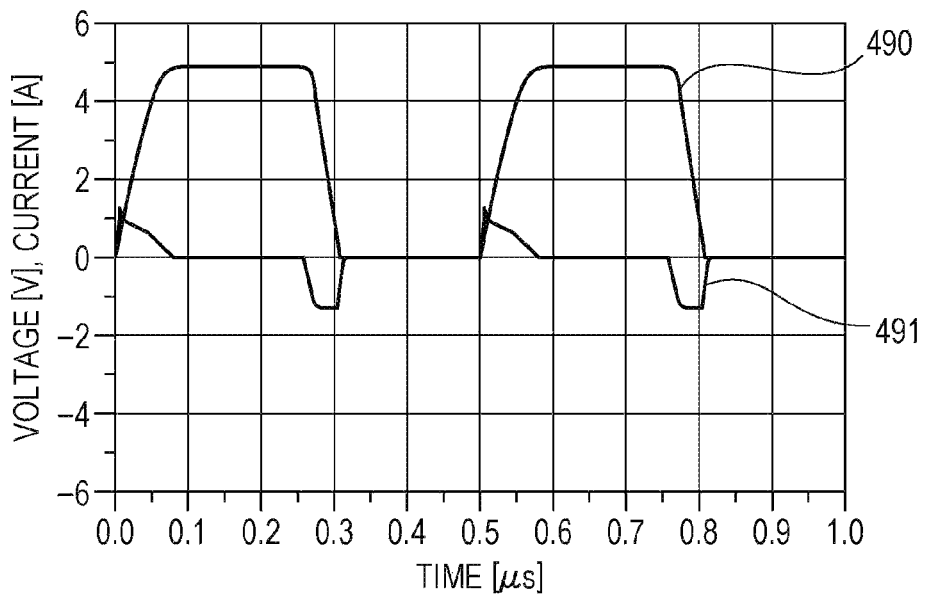
FIG. 4 is a diagram illustrating an example of the temporal waveforms of output voltage and output current in a radio-frequency signal reception circuit according to an embodiment.

FIG. 4 is an example of temporal waveforms of the output voltage 490 and the output current 491 of the radio-frequency signal reception circuit 100. As illustrated in FIG. 4, the output voltage 490 is switched between 5 V and 0 V according to the presence or absence of a carrier wave in the input signal.

Note that the radio-frequency signal reception circuit 100 generates a positive voltage and a ground potential, depending on the presence or absence of a carrier wave in a single input signal input from a single signal isolator. By providing the electromagnetic resonance coupler 180 as the signal isolator, the radio-frequency signal reception circuit 100 is able to realize the above with a simple configuration. For example, when the radio-frequency signal reception circuit has a transformer, the above cannot be realized with a simple configuration like the radio-frequency signal reception circuit 100.

For example, suppose that an isolated signal transmission device of the related art supplies a negative voltage for switching on a power semiconductor switch to the gate terminal of the power semiconductor switch. In this case, the isolated signal transmission device requires a signal isolator that transmits power for putting the power semiconductor switch in the on-state, as well as a signal isolator that transmits power for putting the power semiconductor switch in the off-state. In other words, the isolated signal transmission device of the related art requires two signal isolators, the circuit becomes complicated, and the size increases. In contrast, an isolated signal transmission device according to the embodiment may include at least one signal isolator, and thereby can be compactly realized.

As above, when a negative voltage for switching on a power semiconductor switch is supplied to the gate terminal of the power semiconductor switch, current flows according to the negative voltage. However, with an isolated signal transmission device of the related art, since a large current is difficult to flow therethrough, switching the power semiconductor switch from the on-state to the off-state takes more time. In contrast, the radio-frequency signal reception circuit 100 allows a large current corresponding to the low on-resistance of the transistor 110 to flow through the transistor 110 through which the pathway between the output terminal 103 and the output reference terminal 104 is short-circuited. Thus, the radio-frequency signal reception circuit 100 enables the power semiconductor switch to be switched from the on-state to the off-state in a short time.

Figure 5:
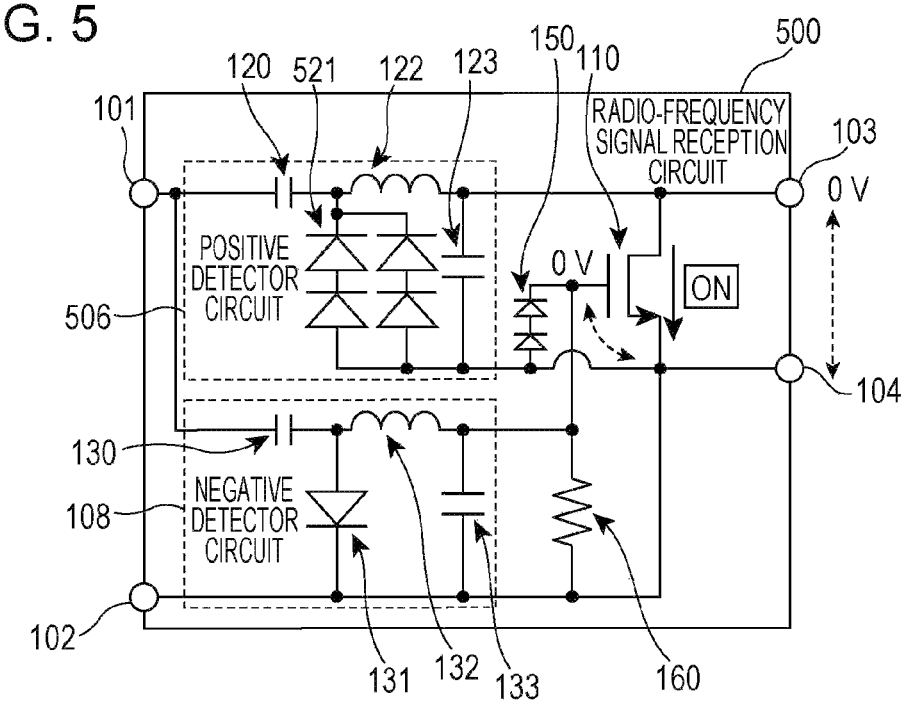
FIG. 5 is a diagram illustrating an example of a radio-frequency signal reception circuit according to a modification of an embodiment.

FIG. 5 is a circuit diagram illustrating an example of a configuration of a radio-frequency signal reception circuit 500 according to a modification of the embodiment. The radio-frequency signal reception circuit 500 is able to output a large output voltage when the input carrier wave is large, or in other words, when the amplitude of the input signal is large. The radio-frequency signal reception circuit 500 corresponds to a circuit obtained by taking the radio-frequency signal reception circuit 100 illustrated in FIG. 1, and replacing the positive diode 121 with a positive diode 521 including multiple diodes connected in series and parallel. In other words, the positive detector circuit 506 corresponds to a circuit obtained by taking the positive detector circuit 106 illustrated in FIG. 1, and replacing the positive diode 121 with a positive diode 521 including multiple diodes connected in series and parallel. Herein, each of the multiple diodes within the positive diode 521 has a threshold voltage and on-resistance similar to the negative diode 131, for example. With this configuration, the threshold voltage of the positive diode 521 is higher than the threshold voltage of the negative diode 131. Also, the on-resistance of the positive diode 521 is lower than the on-resistance of the negative diode 131.

Meanwhile, when the input carrier wave is small, or in other word when the amplitude of the input signal is small, a large negative voltage may be output from the negative detector circuit 108 to reliably turn off the transistor 110. When the input carrier wave is large, or in other words when the amplitude of the input signal is large, a large positive voltage may be output from the positive detector circuit 506, while a comparatively small negative voltage may be output from the negative detector circuit 108, to cause the appropriate output of an output voltage from the radio-frequency signal reception circuit 500.

Like the radio-frequency signal reception circuit 500, if the positive diode 521 includes multiple diodes connected in series and parallel, the positive diode 521 has a high threshold voltage and a low on-resistance compared to the negative diode 131, for example. Herein, the threshold voltage of the positive diode 521 means the minimum input voltage capable of causing a positive voltage to be output from the positive detector circuit 506. By taking such a configuration, until the voltage of the input signal exceeds the threshold voltage of the positive diode 521, a signal is not output from the positive detector circuit 506 and thus only the negative detector circuit 108 performs a detection operation. On the other hand, when the voltage of the input signal exceeds the threshold voltage of the positive diode 521, the positive diode 52 detects the input signal to output a positive voltage, which is large because of the small on-resistance of the positive diode 521. In other words, the radio-frequency signal reception circuit 500 outputs an output signal when the input signal is large, and does not output the output signal when the input signal is small. Consequently, the radio-frequency signal reception circuit 500 can operate appropriately depending on the magnitude of the input signal.

Note that in the radio-frequency signal reception circuit 500, the threshold voltage of the positive diode 521 is higher than the threshold voltage of the negative diode 131, and the on-resistance of the positive diode 521 is lower than the on-resistance of the negative diode 131, but it is also possible for just one of the above to be satisfied. As a result, the rising voltage of the positive detector circuit 506 increases, or the positive output voltage from the positive detector circuit 506 increases.

Figure 6:
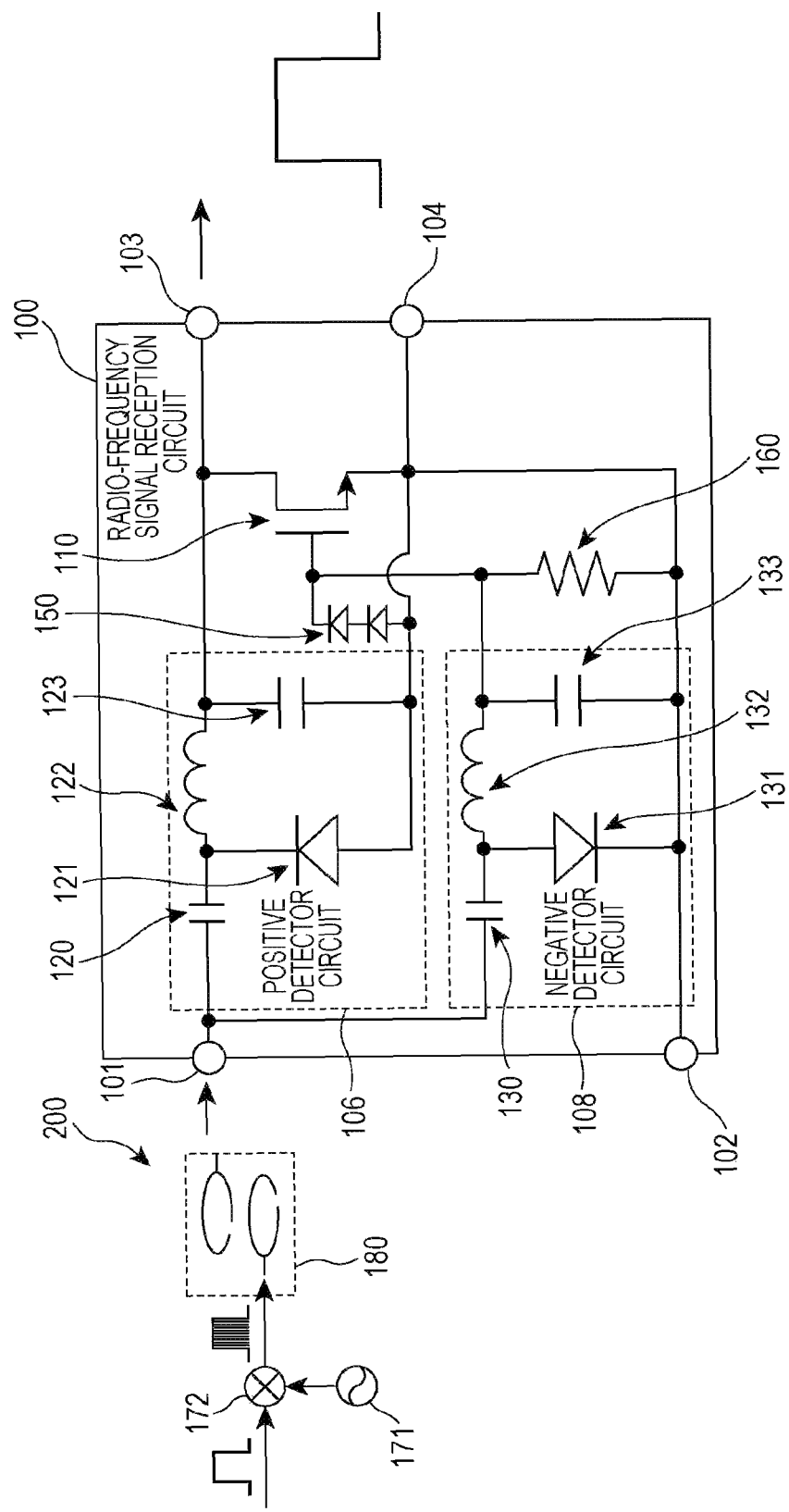
FIG. 6 is a diagram illustrating an example of an isolated signal transmission device according to an embodiment.

FIG. 6 is an example of a circuit diagram of an isolated signal transmission device 200.

The isolated signal transmission device 200 is a circuit used as a gate driver circuit of a semiconductor switch, for example. The isolated signal transmission device 200 corresponds to a configuration obtained by replacing the modulated signal generator circuit 170 with an oscillator 171 and a modulator 172 in the isolated signal transmission device illustrated in FIG. 1. In other words, the isolated signal transmission device 200 includes an oscillator 171 that generates a radio-frequency wave to act as the carrier wave, a modulator 172 that modulates the radio-frequency wave with a pulse signal to generate a modulated signal, an electromagnetic resonance coupler 180 that isolatedly transmits the modulated signal by an electromagnetic resonance, and the radio-frequency signal reception circuit 100 that that receives the modulated signal input from the electromagnetic resonance coupler 180 as an input signal.

The oscillator 171 generates a radio-frequency wave having a frequency of 100 MHz or more as the carrier wave, for example.

The modulator 172 is a circuit that modulates, with a pulse signal, the carrier wave generated by the oscillator 171 to generate a modulated signal. The modulator 172 may also be a mixer that mixes the carrier wave and the pulse signal, for example. The modulator 172 may also be a switch that controls whether the carrier wave is passed through or blocked, depending on the pulse signal, for example. Note that although FIG. 6 illustrates a waveform of the modulated signal with components having voltage values of 0 V or greater, the input signal may also have a waveform with components having voltage values of less than 0. The input signal expresses a waveform that is sign-symmetric about a reference of 0 V in the envelope curve, for example.

In the isolated signal transmission device 200 including such a configuration, a pulse signal is converted to a modulated signal by the modulator 172, and then the modulated signal is isolatedly transmitted by the electromagnetic resonance coupler 180. The transmitted modulated signal is detected by the radio-frequency signal reception circuit 100, and then output as a gate driving signal for a power semiconductor switch, for example.

Note that in the radio-frequency signal reception circuits 100 and 500, the positive diode 121 and the negative diode 131 may also be diodes with a small junction capacitance that operate at high frequency. Such diodes are Schottky barrier diodes, for example.

In the radio-frequency signal reception circuits 100 and 500, the load connected to the output terminal 103 and the output reference terminal 104 is described as a GaN switching device that turns on at a gate voltage of 3 V. However, the radio-frequency signal reception circuits 100 and 500 may also be connected to some other power semiconductor switch.

In the radio-frequency signal reception circuits 100 and 500, when the radio-frequency wave is 2.4 GHz, for example, GaN Schottky barrier diodes may be used as the positive diode 121 and the negative diode 131. In this case, by taking the inductance of the positive inductor 122 and the negative inductor 132 to be 5.8 nH, and the capacitance of the positive coupling capacitor 120 and the negative coupling capacitor 130 to be 0.7 pF, for example, the positive detector circuit 106 and the negative detector circuit 108 operate as 2.4 GHz detector circuits.

Since such an isolated signal transmission device 200 includes the electromagnetic resonance coupler 180, the primary side on which the input signal is generated and the secondary side on which the output signal is generated can be isolated, and the rising time of the output signal can be shortened. Furthermore, since the isolated signal transmission device 200 includes the radio-frequency signal reception circuit 100, the falling time of the output signal can be shortened. With this configuration, the isolated signal transmission device 200 is able to isolatedly transmit a high-speed signal, and drive a semiconductor switch at high speed.

Furthermore, the modulator and the signal isolator on the input side of the radio-frequency signal reception circuit 100 are able to output a common input signal to both the positive detector circuit 106 and the negative detector circuit 108. For this reason, the isolated signal transmission device 200 can be realized with a single circuit subsystem of a modulator and a signal isolator. Consequently, the isolated signal transmission device 200 can become more compact.

Other Embodiments

The foregoing thus describes a radio-frequency signal reception circuit and an isolated signal transmission device according to aspects of the present disclosure, on the basis of an embodiment. However, the present disclosure is not limited to the foregoing embodiment. Embodiments obtained by applying various modifications that may occur to persons skilled in the art as well as embodiments constructed by combining the structural components in different embodiments may also be included within the scope of the one or more exemplary embodiments of the present disclosure, insofar as such embodiments do not depart from the spirit of the present disclosure.

For example, the isolated signal transmission device 200 illustrated in FIG. 6 includes the radio-frequency signal reception circuit 100 illustrated in FIG. 1, but an isolated signal transmission device may also include the radio-frequency signal reception circuit 500 illustrated in FIG. 5.

The isolated signal transmission device 200 includes the electromagnetic resonance coupler 180 as a signal isolator, but instead of an electromagnetic resonance coupler, another element that provides isolated transmission of a radio-frequency wave may also be provided.

In the radio-frequency signal reception circuits 100 and 500, the transistor 110 is an N-channel transistor, but may also be a P-channel transistor. In this case, the source terminal of the P-channel transistor is connected to the output terminal 103, the drain terminal is connected to the output reference terminal 104, and the gate terminal is connected to the negative detector circuit 108.

For example, a radio-frequency signal reception circuit is a radio-frequency signal reception circuit that detects an input signal, which is a signal obtained by modulating a carrier wave with a pulse signal. The radio-frequency signal reception circuit includes: an input terminal and an input reference terminal for receiving the input signal, an output terminal and an output reference terminal for outputting a pulse signal after detection, a positive detector circuit that detects the input signal, and outputs a pulse signal of positive voltage to the output terminal using the output reference terminal as a reference; a normally-on type transistor having a first terminal connected to the output terminal, a second terminal connected to the output reference terminal, and a control terminal; and a negative detector circuit that detects the input signal, and outputs a pulse signal of negative voltage to the control terminal of the transistor using the output reference terminal as a reference.

For example, the input signal is a signal expressed by the presence or absence of a carrier wave, whereby the negative detector circuit outputs to the control terminal of the transistor a pulse signal that takes a negative voltage when the carrier wave appears in the input signal, and takes a reference voltage when the carrier wave does not appear in the input signal, while the transistor turns off when the negative voltage is input from the negative detector circuit, and turns on when the reference voltage is input from the negative detector circuit.

Note that the circuit configuration illustrated in the foregoing description and the drawings is an example, and the present disclosure is not limited to the foregoing circuit configuration. In other words, a circuit able to realize the characteristic functions of the present disclosure similarly to the foregoing circuit configuration is also included in the present disclosure. For example, the present disclosure also includes configurations in which an element such as a switch (e.g., transistor), resistive element, or capacitive element is connected to a given element in series or parallel, within a range that still enables the realization of functions similar to the foregoing circuit configuration. In other words, the term "connected" in the foregoing description is not limited to the case of two terminals being connected directly, and also encompasses the case of the two terminals being connected via an element, insofar as similar functionality may be realized.

In the present disclosure, terms related to the input and output of a signal are not limited to the case of the signal being input or output directly, and also encompass the case of the signal being input or output indirectly. For example, phrases such as "the signal is output from A to B", "the signal is input from A into B", and "the signal is output from A and input into B" also encompass configurations that include some other element or circuit between A and B. Additionally, such phrases also encompass a signal being output from A, modified via some other element or circuit, and then input into B.

A radio-frequency signal reception circuit and an isolated signal transmission device according to the present disclosure is useful as a gate driver circuit that drives a semiconductor switch.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A signal reception circuit comprising:
an input terminal;
an input reference terminal;
an output terminal;
an output reference terminal that has the same potential as the input reference terminal;
a normally-on type transistor that includes a first terminal directly connected to the output terminal, a second terminal directly connected to the output reference terminal, and a control terminal;
a first detector circuit, connected to the input terminal, the output terminal, and the output reference terminal, that detects an input signal applied between the input terminal and the input reference terminal, to apply an output signal between the output terminal and the output reference terminal, the input signal being a modulated signal that is generated by modulating a radio-frequency wave with a pulse signal; and
a second detector circuit, connected to the input terminal, the control terminal of the normally-on type transistor, and the output reference terminal, that detects the input signal applied between the input terminal and the input reference terminal, to apply a negative voltage pulse to the control terminal of the normally-on type transistor with the output reference terminal as a reference.

2. The signal reception circuit according to claim 1, wherein the second detector circuit
applies, when the input signal takes a first amplitude, a first voltage value of 0 or a negative value to the control terminal of the normally-on type transistor with the output reference terminal as a reference, causing the normally-on type transistor to be in an on-state, and
applies, when the input signal takes a second amplitude greater than the first amplitude, a second voltage value smaller than the first voltage value to the control terminal of the normally-on type transistor with the output reference terminal as a reference, causing the normally-on type transistor to be in an off-state.

3. The signal reception circuit according to claim 1, wherein the first detector circuit applies, as the output signal, a positive voltage pulse to the output terminal with the output reference terminal as a reference.

4. The signal reception circuit according to claim 1, further comprising:
a diode connected between the control terminal and the output reference terminal.

5. The signal reception circuit according to claim 1, further comprising:
a resistor connected between the control terminal and the output reference terminal.

6. An isolated signal transmission device comprising:
an oscillator that generates a radio-frequency wave;
a modulator that modulates the radio-frequency wave with a pulse signal to generate a modulated signal;
an electromagnetic resonance coupler that performs isolated transmission of the modulated signal by electromagnetic resonance; and
the signal reception circuit of claim 1 to which the modulated signal is input from the electromagnetic resonance coupler.

7. A signal reception circuit comprising:
an input terminal;
an input reference terminal;
an output terminal;
an output reference terminal that has the same potential as the input reference terminal;
a normally-on type transistor that includes a first terminal connected to the output terminal, a second terminal connected to the output reference terminal, and a control terminal;
a first detector circuit, connected to the input terminal, the output terminal, and the output reference terminal, that detects an input signal applied between the input terminal and the input reference terminal, to apply an output signal between the output terminal and the output reference terminal, the input signal being a modulated signal that is generated by modulating a radio-frequency wave with a pulse signal; and
a second detector circuit, connected to the input terminal, the control terminal of the normally-on type transistor, and the output reference terminal, that detects the input signal applied between the input terminal and the input reference terminal, to apply a negative voltage pulse to the control terminal of the normally-on type transistor with the output reference terminal as a reference,
wherein the first detector circuit includes:
a first coupling capacitor that includes a first terminal connected to the input terminal, and a second terminal,
a first diode that includes a cathode connected to the second terminal of the first coupling capacitor, and an anode connected to the output reference terminal,
a first inductor that includes a third terminal connected to the second terminal of the first coupling capacitor, and a fourth terminal, and
a first smoothing capacitor connected between the fourth terminal of the first inductor and the output reference terminal.

8. A signal reception circuit comprising:
an input terminal;
an input reference terminal;
an output terminal;
an output reference terminal that has the same potential as the input reference terminal;
a normally-on type transistor that includes a first terminal connected to the output terminal, a second terminal connected to the output reference terminal, and a control terminal;
a first detector circuit, connected to the input terminal, the output terminal, and the output reference terminal, that detects an input signal applied between the input terminal and the input reference terminal, to apply an output signal between the output terminal and the output reference terminal, the input signal being a modulated signal that is generated by modulating a radio-frequency wave with a pulse signal; and
a second detector circuit, connected to the input terminal, the control terminal of the normally-on type transistor, and the output reference terminal, that detects the input signal applied between the input terminal and the input reference terminal, to apply a negative voltage pulse to the control terminal of the normally-on type transistor with the output reference terminal as a reference,
wherein the second detector circuit includes:
a second coupling capacitor that includes a first terminal connected to the input terminal, and a second terminal,
a second diode that includes an anode connected to the second terminal of the second coupling capacitor, and a cathode connected to the output reference terminal, a second inductor that includes a third terminal connected to the second terminal of the second coupling capacitor, and a fourth terminal, and a second smoothing capacitor connected between the fourth terminal of the second inductor and the output reference terminal.

9. The signal reception circuit according to claim 7, wherein the second detector circuit includes:

a second coupling capacitor that includes a first terminal connected to the input terminal, and a second terminal, a second diode that includes an anode connected to the second terminal of the second coupling capacitor, and a cathode connected to the output reference terminal, a second inductor that includes a third terminal connected to the second terminal of the second coupling capacitor, and a fourth terminal, and a second smoothing capacitor connected between the fourth terminal of the second inductor and the output reference terminal.

10. The signal reception circuit according to claim 9, wherein a threshold voltage of the first diode is higher than a threshold voltage of the second diode.

11. The signal reception circuit according to claim 9, wherein an on-resistance of the first diode is lower than an on-resistance of the second diode.

\* \* \* \* \*